US008659299B2

(12) United States Patent  
Cheng et al.

(10) Patent No.: US 8,659,299 B2
(45) Date of Patent: Feb. 25, 2014

(54) BATTERY VOLTAGE MEASUREMENT SYSTEM AND METHOD THEREOF

(75) Inventors: Ming-Wang Cheng, Taoyuan County (TW); Hsiang-Chun Hsueh, Taipei (TW)

(73) Assignee: Lite-On Clean Energy Technoloy Corp., Taipei (TW)

( * ) Notice: Subject to any disclaimer, the term of this patent is extended or adjusted under 35 U.S.C. 154(b) by 348 days.

(21) Appl. No.: 13/223,868

(22) Filed: Sep. 1, 2011

(65) Prior Publication Data

US 2013/0002259 A1   Jan. 3, 2013

(30) Foreign Application Priority Data

Jul. 1, 2011 (TW) ................................. 100123390

(51) Int. Cl.
*G01N 27/416* (2006.01)
(52) U.S. Cl.
USPC .......................................... 324/426; 320/137
(58) Field of Classification Search
USPC ......................................................... 324/426
See application file for complete search history.

(56) References Cited

U.S. PATENT DOCUMENTS

| | | | | |
|---|---|---|---|---|
| 6,388,449 B1* | 5/2002 | Ramsden | ....................... | 324/426 |
| 6,417,668 B1* | 7/2002 | Howard et al. | ................ | 324/426 |
| 7,129,707 B2* | 10/2006 | Kikuchi | ........................ | 324/426 |
| 7,425,832 B2* | 9/2008 | Gopal et al. | ................... | 324/426 |
| 2003/0038637 A1* | 2/2003 | Bertness et al. | ............... | 324/426 |
| 2006/0038572 A1* | 2/2006 | Philbrook | ..................... | 324/426 |

* cited by examiner

*Primary Examiner* — Arun Williams
(74) *Attorney, Agent, or Firm* — Li & Cai Intellectual Property (USA) Office

(57) ABSTRACT

A battery voltage measurement system is disclosed. The system includes a measurement unit, a calibration unit, and a control unit. The calibration unit is coupled between the measurement unit and a battery, for providing several test voltages to the measurement unit. The control unit is coupled to the calibration unit and the measurement unit, for controlling the calibration unit and for receiving an output voltage of the measurement unit. Under a calibration mode, the calibration unit outputs test voltages to the measurement unit, and the control unit calculates a calibration value according to a relation between the test voltages and the output voltage of the measurement unit. Under a measurement mode, the calibration unit transmits a battery voltage to the measurement unit, and the control unit calibrates the output voltage of the measurement unit according to the calibration value for acquiring accurate value of the battery voltage.

13 Claims, 5 Drawing Sheets

BATTERY VOLTAGE MEASUREMENT SYSTEM AND METHOD THEREOF

BACKGROUND OF THE INVENTION

1. Field of the Invention

The present invention relates to a measurement unit of a battery voltage; in particular, to a battery voltage measurement system with self-calibration capability.

2. Description of Related Art

Presently, the transportations use fossil fuels as a major power source. However, burning the fossil fuels may cause ecological environment problems and greenhouse effects. For reducing the dependency on fossil fuels, every country of the world is developing alternative energy for replacing fossil fuel. Because the electric car may be environmentally-friendly, many major vehicle manufacturers and countries invest a lot of resources in developing relative issues. Among the relative issues of the electric car, the battery and electric power management techniques may be the most important techniques.

The most significant capability of a high voltage battery management system is measuring the battery voltage, for avoiding the battery from overcharging or over-discharging. In order to measure the battery voltage precisely, the measurement circuit may include a microcontroller, an analog to digital converter, an operational amplifier, and a resistor for executing the measurement. However, the ageing and damaging problems, the ambient, and the work temperature may all influence the circuit characteristics of the electric components, and thus result in measurement errors.

Conventionally, the high voltage battery management system usually cannot determine the self-made measurement errors and do self calibration. The accuracy of voltage measurement which is done by the high voltage battery management system must be confirmed by external measurement devices, which causes extra costs and lowers usage convenience.

SUMMARY OF THE INVENTION

The object of the present invention is to disclose a battery voltage measurement system which has self-determining and self-calibrating capabilities. By providing fixed voltage for detection and software for control, the errors of battery voltage measurement lie within an allowable range. Therefore, the usage safety and lifespan of the series battery may be improved.

In order to achieve the aforementioned objects, according to an embodiment of the present invention, a battery voltage measurement system is disclosed. The battery voltage measurement system is applicable for measuring a battery voltage of a battery, and includes a measurement unit, a calibration unit, and a control unit. The measurement unit is used for measuring the battery voltage. The calibration unit is coupled between the battery and the measurement unit, for providing several test voltages to the measurement unit. The control unit is coupled to the measurement unit and the calibration unit, for controlling the calibration unit and for receiving an output voltage of the measurement unit. It is worth noting that the battery voltage measurement system has a calibration mode and a measurement mode. Under the calibration mode, the calibration unit outputs the test voltages to the measurement unit, and the control unit calculates a calibration value according to a relation between the test voltages and the output voltage of the measurement unit. Under the measurement mode, the calibration unit transmits the battery voltage to the measurement unit, and the control unit calibrates the output voltage of the measurement unit according to the calibration unit for acquiring the battery voltage correctly.

According to another embodiment of the present invention, a battery voltage measurement method is disclosed. The method includes a step of providing a plurality of test voltages to a measurement unit. The method also includes a step of calculating a calibration value according to a relation between the test voltages and an output voltage of the measurement unit. Moreover, the method further includes a step of transmitting a battery voltage to the measurement unit for measuring the battery voltage and calibrating the output voltage of the measurement unit according to the calibration value.

On the basis of the above, the battery voltage measurement system and method thereof according to the present invention may provide test voltages by themselves for determining whether the measurement circuits have an error or not, and may eliminating the error for acquiring precise battery voltage.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

The drawings included herein provide further understanding of the present disclosure. A brief introduction of the drawings is as follows.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

First embodiment

Figure 1:
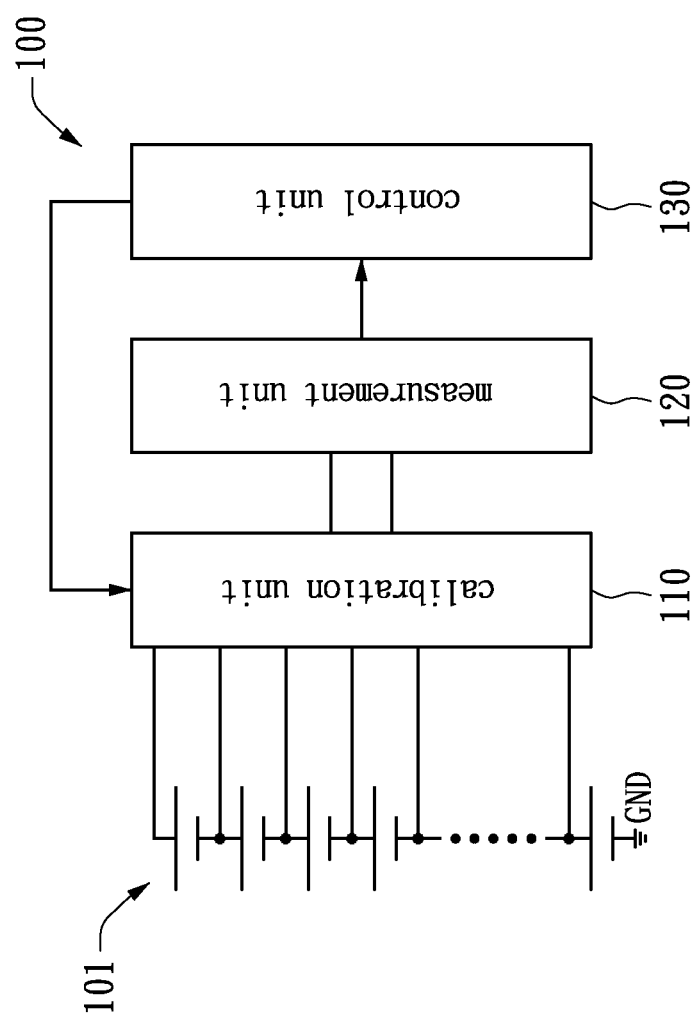
FIG. 1 shows a function block diagram of a battery voltage measurement system according to a first embodiment of the present invention.

FIG. 1 is a function block diagram of a battery voltage measurement system according to a first embodiment of the present invention. The battery voltage measurement system 100 includes a calibration unit 110, a measurement unit 120, and a control unit 130. The calibration unit 110 is coupled between a series battery 101 and the measurement unit 120, and the control unit 130 is coupled to the calibration unit 110 and the measurement unit 120. The battery voltage measurement system 100 has a calibration mode and a measurement mode.

Under the calibration mode, the control unit 130 may enable the calibration unit 110 for outputting test voltages to an input end of the measurement unit 120, and may obtain gain, linearity, and some circuit parameters of the measurement unit 120 according to a relation between the test voltages and an output voltage of the measurement unit 120. The control unit 130 may further calculate a calibration value according to the parameters obtained under the calibration mode. Under the measurement mode, the calibration unit 110 may transmit the battery voltage of the series battery 101 to the measurement unit 120 for measuring. The control unit 130 may calibrate the output voltage of the measurement unit 120 according to the calibration value for deriving accurate value of the battery voltage. It is worth noting that the battery voltage may be the voltage of one single battery or several batteries in serial connection, and the embodiment is not restricted thereby.

The linearity or other circuit characteristics of the electric component may be influenced by the ageing and damaging problems of itself, the ambient, the work temperature, and some other factors, and may generate errors therefore. Thus, after executing the calibration mode, the battery voltage measurement system 100 may acquire the circuit characteristics of the measurement unit 120 again, for calibrating the output voltage of the measurement unit 120. Therefore, the battery voltage measurement system 100 may obtain much more accurate battery voltage, and may eliminate the measurement errors caused by the circuit characteristic changes of the measurement unit 120.

Figure 2:
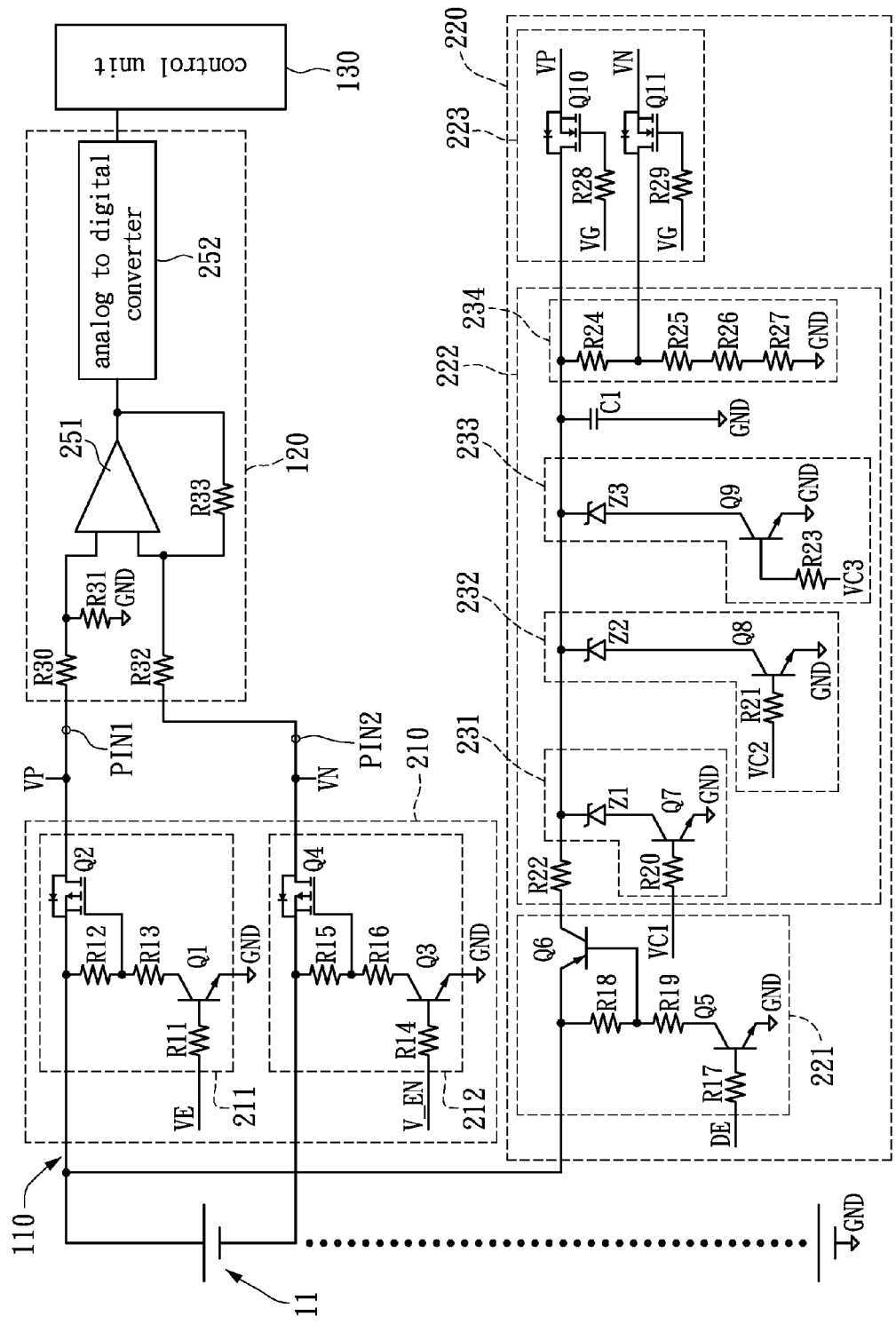
FIG. 2 shows a circuit diagram of a battery voltage measurement system according to the first embodiment of the present invention.

Please refer to FIG. 1 and FIG. 2 in the meantime. FIG. 2 is a circuit diagram of the battery voltage measurement system 100 according to this embodiment. The calibration unit 110 includes an isolation unit 210 and a voltage generation unit 220. The isolation unit 210 is coupled between the input end of the measurement unit 120 and the series battery 101. Under the calibration mode, the isolation unit 210 may isolate the series battery 101 and the measurement unit 120 for preventing the measurement unit 120 from being influenced by the voltage of the series battery 101. Under the measurement mode, the isolation unit 210 may transmit the battery voltage of the series battery 101 to the measurement unit 120 for measuring the magnitude of the battery voltage. The voltage generation unit 220 may generate test voltages VN and VP to the measurement unit 120 under the calibration mode.

The isolation unit 210 includes a first isolation circuit 211 and a second isolation circuit 212 which are coupled between respective two input ends of the measurement unit 120 and the series battery 101. The first isolation circuit 211 includes resistors R11, R12, R13, an NPN transistor Q1, and a PMOS transistor Q2. A source node and a drain node of the PMOS transistor Q2 are respectively connected to a positive end of a battery 11 and a first input end PIN1 of the measurement unit 120. The resistor R12 is coupled between the source node and a gate node of the PMOS transistor Q2. The resistor R13 is coupled between the gate node of the PMOS transistor Q2 and a collector node of the NPN transistor Q1. A base node of the NPN transistor Q1 is coupled to an enable signal VE through the resistor R11. The second isolation circuit includes resistors R14, R15, R16, an NPN transistor Q3, and a PMOS transistor Q4. The PMOS transistor Q4 is coupled between a negative end of the battery 11 and a second input end of the measurement unit 120. The remaining circuit connections are similar to their counterparts in the first isolation circuit 211, thus the following disclosures may not go into details again. The control unit 130 may be connected to the base nodes of the NPN transistors Q1 and Q3 through the resistors R11 and R14 respectively, and may adjust the enable signal VE for turning on or off the PMOS transistors Q2 and Q4.

When the enable signal VE is high, the PMOS transistors Q2 and Q4 may be turned on for transmitting the voltage difference between two ends of the battery 11 to the measurement unit 120. On the other hand, when the enable signal VE is low, the PMOS transistors Q2 and Q4 may be turned off for isolating the battery 11 from the measurement unit 120. The control unit 130 may output the enable signal VE to the isolation unit 210 according to the changes of the operation modes, for isolating the battery 11 and the measurement unit 120 under the calibration mode.

The voltage generation unit 220 includes an enable circuit 221, a voltage generation circuit 222, and an output isolation circuit 223. The enable circuit 221 includes resistors R17, R18, R19, an NPN transistor Q5, and a PNP transistor Q6. An emitter node and a collector node of the PNP transistor Q6 are coupled to the positive end of the battery 11 and the voltage generation circuit 222 respectively in order to transmit electric power to the voltage generation circuit 222 for generating the test voltages VP and VN. The resistor R18 is coupled between the emitter node and a base node of the PNP transistor Q6. The resistor R19 is coupled between the base node of the PNP transistor Q6 and a collector node of the NPN transistor Q5. An emitter node of the NPN transistor Q5 is coupled to a ground GND, and a base node of the NPN transistor Q5 is coupled to a determination enabling signal DE. The control unit 130 may output the determination enabling signal DE to the NPN transistor Q5 for controlling the PNP transistor Q6.

When the determination enabling signal DE is high, the PNP transistor Q6 is turned on for transmitting the electric power of the series battery 101 to the voltage generation circuit 222. On the other hand, when the determination enabling signal DE is low, the PNP transistor Q6 is turned off for isolating the series battery 101 from the voltage generation circuit 222. Under this situation, the voltage generation circuit 222 has no operation.

The voltage generation circuit 222 includes a resistor R22, a capacitor C1, and a plurality of bias generation circuits 231, 232, 233, and a voltage division circuit 234. The resistor R22 is serially connected between the enabling circuit 221 and each of the bias voltage generation circuits 231, 232, and 233. The capacitor C1 is coupled between the output end of each of the bias voltage generation circuits 231, 232, 233 and the ground GND. Each of the bias voltage generation circuit 231, 232, and 233 includes standard voltage components and the NPN transistor. The bias voltage generation circuit 231 includes a resistor R20, a standard voltage component Z1, and an NPN transistor Q7. The standard voltage component Z1 is coupled between one end of the resistor R22 and a collector node of the NPN transistor Q7. An emitter node of the NPN transistor Q7 is coupled to the ground GND, and a base node of the NPN transistor Q7 is coupled to the control signal VC1 through the resistor R20. The bias voltage generation circuit 232 includes a resistor R21, a standard voltage component Z2, and an NPN transistor Q8. The bias voltage generation circuit 233 includes a resistor R23, a standard voltage component Z3, and an NPN transistor Q9. The circuit structures of the bias voltage generation circuits 232 and 233 are similar to the circuit structure of the bias voltage generation circuit 231, thus the following disclosures may not go into details again. The standard voltage component Z1 may be a zener diode, but the scope of the present invention is not limited thereby.

The bias voltage generation circuits 231, 232, and 233 are controlled by the control signals VC1, VC2, and VC3 respectively. The control unit 130 may change the bias voltages generated by the bias voltage generation circuit 231, 232, and 233 by adjusting the control signals VC1, VC2, and VC3. It is worth noting that there are three bias voltage generation circuits 231, 232, and 233 in this embodiment, but the number of the bias voltage generation circuit is not limited thereby.

The voltage division circuit 234 is formed by several resistors R24 to R27 which are in serial connection, and is coupled between the bias voltage generation circuits 231 to 233 and the ground GND.

The output isolation circuit 223 includes two NMOS transistors Q10 and Q11 which are respectively coupled between one end of the resistor R24 and the first input end PIN1 of the measurement unit 120 and between another end of the resistor R24 and the second input end of the measurement unit 120. A gate node of the NMOS transistor is coupled to the output voltage VG of the enabling circuit 221 through the resistor R28. Thus when the enabling circuit 221 is active, its output voltage VG is high, which turns on the NMOS transistors Q10 and Q11 for outputting test voltages VP and VN. On the other hand, when the enabling circuit 221 is inactive, its output voltage is low, which turns off the NMOS transistors Q10 and Q11. In other words, the output isolation circuit 223 is controlled by the output voltage VG of the enabling circuit 221. When the determination enabling signal DE is active, the NMOS transistors Q10 and Q11 of the output isolation circuit 223 are turned on. When the determination enabling signal DE is inactive, the NMSO transistors Q10 and Q11 of the output isolation circuit 223 are turned off In this embodiment, the test voltages VP and VN may not be the voltages of the two ends of the resistor R24, they may be switched to different divisional voltage of different resistors.

It is worth noting that the major function of the voltage generation circuit 222 is to generate the test voltages, it may be implemented by several different circuit designs. For example, the circuit structures of the voltage generation circuit 222 may be implemented by simple resistors or digital to analog converters for generating analog voltages. The structure of the voltage generation circuit 222 is not restricted to the one shown in FIG. 2.

The measurement unit 120 includes an operational amplifier 251, an analog to digital converter 252, and resistors R30, R31, R32, and R33. The resistor R30 is coupled between the first input end PIN1 and a non-inverted input end of the operational amplifier 251. The resistor R31 is coupled between the non-inverted input end of the operation amplifier 251 and the ground GND. The resistor R32 is coupled between an inverted input end of the operational amplifier 251 and the second input end PIN2. The resistor R33 is coupled between the inverted input end and an output end of the operational amplifier 251. The analog to digital converter 252 is coupled between the output end of the operational amplifier 251 and the control unit 130, for converting the output voltage of the operational amplifier 251 into digital signals and transmitting the output voltage to the control unit 130. The control unit 130 may be a micro controller, but the implementation of the control unit 130 is not restricted thereby.

In this embodiment, because there are three bias voltage generation circuits 231 to 233, at least three sets of different test voltages VN and VP may be generated. Under the calibration mode, the control unit 130 may control the calibration unit 110 by adjusting the enabling signal VE, the determination enabling signal DE, and the control signals VC1 to VC3 for detecting the errors, gains, and circuit characteristics of the measurement unit 120. For example, the control unit 130 may enable the control signals VC1 to VC3 in sequence for generating three sets of different test voltages VP and VN to the measurement unit 120, and may acquire the gains and linearity of the measurement unit 120 according to the changes of the output voltage of the measurement unit 120.

Figure 3:
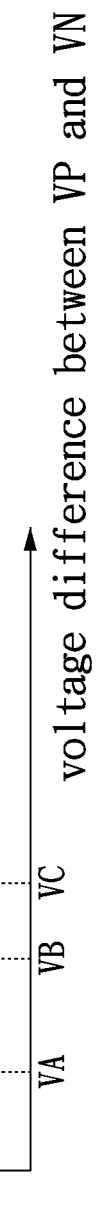
FIG. 3 shows a schematic diagram of a measurement result according to the first embodiment of the present invention.

Please refer to FIG. 3. FIG. 3 shows a schematic diagram of measurement results according to an embodiment of the present invention. Assuming that the voltage differences of the three sets of test voltages VP and VN are voltage VA, VB, and VC, and the output voltages of the measurement unit 120 are V1, V2, and V3 respectively. As shown in FIG. 3, within the range from voltage VA to VC, the measurement unit 120 is not linear. The control unit 130 may calculate a calibration value according to a relation between three sets of the test voltages VP, VN and the output voltage of the measurement unit 120. After that, under the measurement mode, the control unit 130 may calibrate the output voltage of the measurement unit 120 according to the calibration value, for obtaining accurate value of the battery voltage.

In addition, under the calibration mode, the control unit 130 may enable the determination enabling signal DE, for making the enabling circuit 221 transmit electric power to the voltage generation circuit 222 and generate test voltages VP and VN to the measurement unit 120 accordingly. The control unit 130 may simultaneously turn off the PMOS transistors Q2 and Q4 of the isolation unit 210 for isolating the series battery 101 and the measurement unit 120. Under the measurement mode, the voltage generation unit 220 may not output the test voltages VP and VN, and the control unit 130 may simultaneously turn on the PMOS transistors Q2 and Q4 of the isolation unit 210 for transmitting the battery voltage of the battery 11 to the measurement unit 120.

In other words, the battery voltage measurement system 100 may test circuit characteristics of the measurement unit 120 by itself, and then calibrate the output voltage of the measurement unit 120 according to the results of the test for improving the accuracy of the battery voltage measurement. The operations of the calibration may be executed and calculated by software, without adjusting hardware circuits. In addition, when the control unit 130 finds out that there is error generated by the measurement unit 120, it may tell the user relative information by using the communication capability of the microprocessor.

It is worth noting that the enabling signal VE, the determination enabling signal DE, and the control signals VC1 to VC3 received by the calibration unit 110 may be transmitted from the control unit 130 or an outer system, thus the sources where the signals come from do not be limited by this embodiment. The battery voltage measurement system 100 may includes several sets of calibration units 110 and measurement units 120 in correspondence to other batteries of the series battery 101. The number of sets of the calibration units 110 and the measurement units 120 are not restricted thereby. In addition, there may also have a plurality of isolation units 210 and voltage generation units 220 disposed in each calibration unit 110 for coupling to different batteries. On the basis of the aforementioned embodiments and descriptions, the person skilled in the art may derive other kinds of implementations within the scope of the present invention, and the following disclosures may not go into details again.

Second Embodiment

Figure 4:
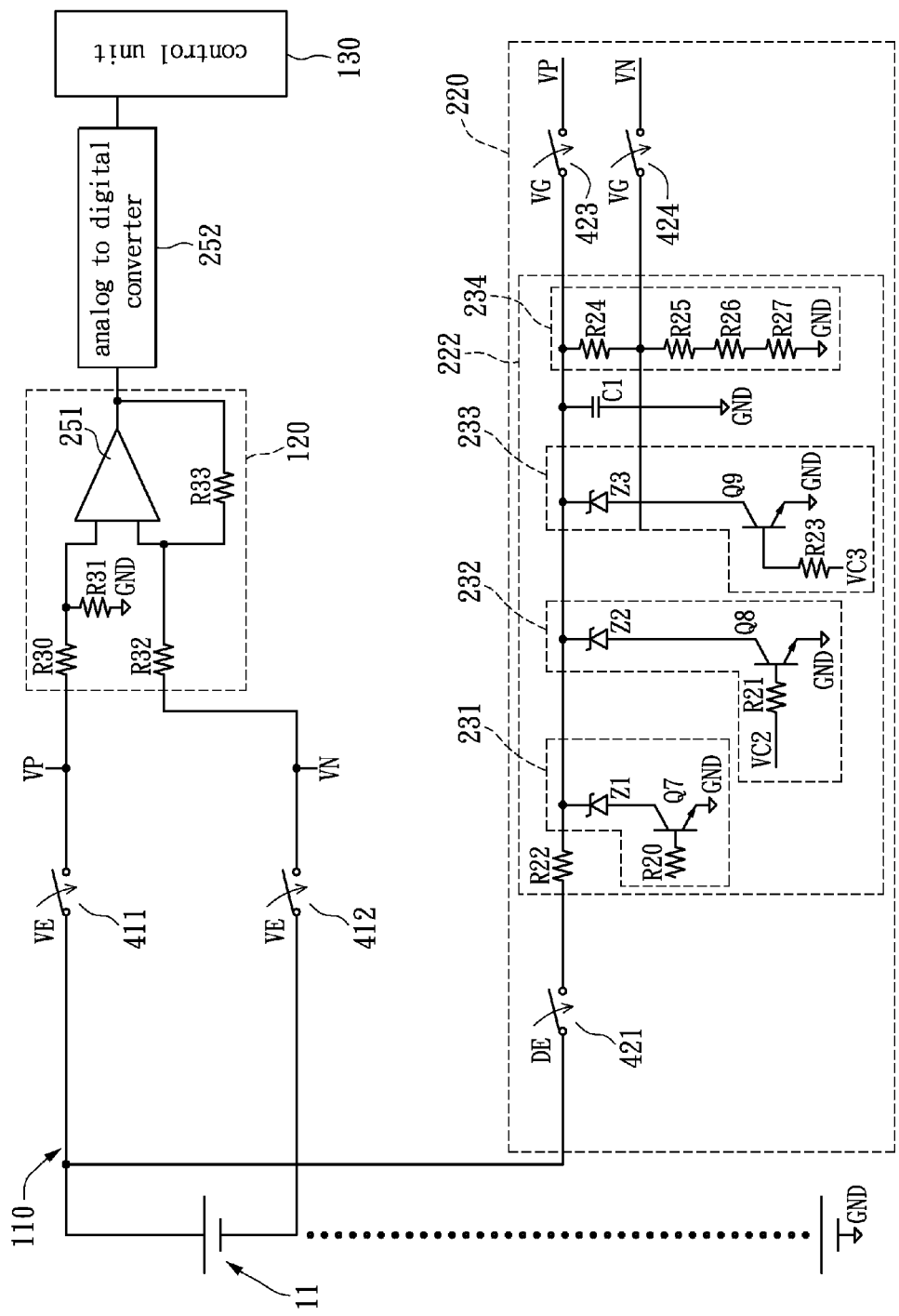
FIG. 4 shows a circuit diagram of a battery voltage measurement system according to a second embodiment of the present invention.

The first isolation circuit 211, the second isolation circuit 212, the enabling circuit 221, and the output isolation circuit 223 in FIG. 2 may be implemented by switches such as PMOS transistors, NMOS transistors, BJT transistors, or relays, and the types of switches are not restricted thereby. Please refer to FIG. 4 which shows a circuit diagram of battery voltage measurement system according to a second embodiment of the present invention. The differences between FIG. 4 and FIG. 2 are that a switch 411 is used for replacing the first isolation circuit 211, a switch 412 is used for replacing the second isolation circuit 212, a switch 421 is used for replacing the enabling circuit 221, and switches 423, 424 are used for replacing the output isolation circuit 223. The remaining circuit structures and operation manners in FIG. 4 are the same as their counterparts in FIG. 2, thus the following disclosures may not go into details again.

Figure 5:
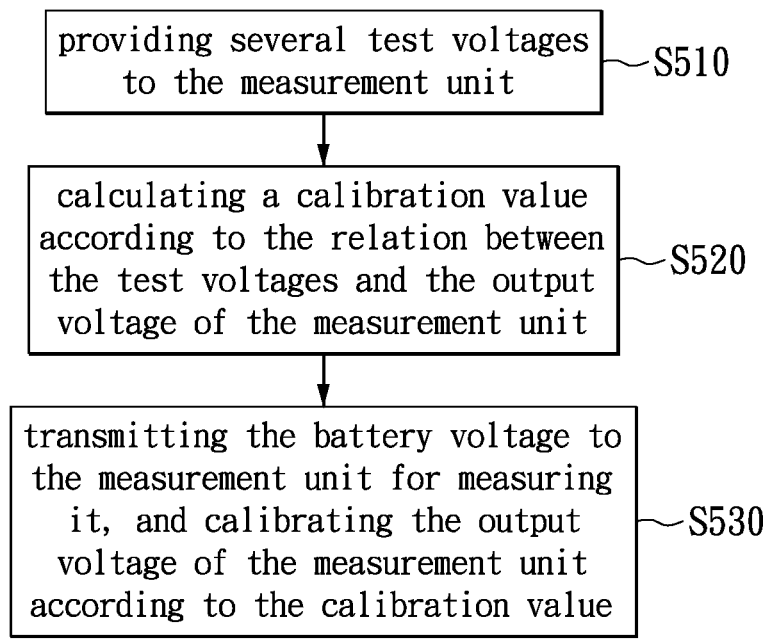
FIG. 5 shows a flow chart of battery voltage measurement method according to an embodiment of the present invention.

On the basis of the aforementioned embodiments, a battery voltage measurement method may be concluded. Please refer to FIG. 2 and FIG. 5. FIG. 5 shows a flow chart of the battery voltage measurement method according to an embodiment of the present invention. Firstly, the calibration unit 110 may provide several test voltages to the measurement unit 120 (step S510). Then the control unit 130 may calculate a calibration value according to the relation between the test voltages and the output voltage of the measurement unit 120 (step S520). After acquiring the calibration value, the calibration unit 110 may enter the measurement mode and transmits the battery voltage to the measurement unit 120 for measuring it, and under the measurement mode, the control unit 130 may calibrate the output voltage of the measurement unit 120 according to the calibration value for obtaining accurate value of the battery voltage (step S530). Other details of the method are described in the first embodiment presented above. The person skilled in the art may know the implementation manners of the present invention according to the aforementioned descriptions and embodiments, thus the following disclosure may not go into details repeatedly.

In the embodiments described above, the PNP transistor may be an abbreviation of PNP bipolar junction transistor, the NPN transistor may be an abbreviation of NPN bipolar junction transistor, the NMOS transistor may be an abbreviation of N channel metal oxide semiconductor field effect transistor, and the PMOS transistor may be an abbreviation of P channel metal oxide semiconductor field effect transistor.

In addition, it is worth noting that the coupling connection between two of the aforementioned components may be a direct connection or an indirect connection which has the capability to transmit electric signals, and the present invention is not restricted thereby. The technique manners of the embodiments may be used independently or together, the number of the components may be increased, reduced, removed, adjusted, or replaced, and the scope of the present invention is not restricted thereby. The person skilled in the art may know the implementation manners of the present invention according to the aforementioned descriptions and embodiments, thus the following disclosure may not go into details repeatedly.

On the basis of the above, the battery voltage measurement system of the present invention may provide test voltages for testing the circuit characteristics of the measurement unit, and for eliminating the errors of the measurement unit. Therefore, according to the present invention, the measurement errors caused by component ageing, damaging, or the ambient may be reduced, and the accurate value of the battery voltage may be acquired.

Some modifications of these examples, as well as other possibilities will, on reading or having read this description, or having comprehended these examples, will occur to those skilled in the art. Such modifications and variations are comprehended within this disclosure as described here and claimed below. The description above illustrates only a relative few specific embodiments and examples of the present disclosure. The present disclosure, indeed, does include various modifications and variations made to the structures and operations described herein, which still fall within the scope of the present disclosure as defined in the following claims.

What is claimed is:

1. A battery voltage measurement system suitable for measuring a battery voltage of a battery, comprising:
    a measurement unit for measuring the battery voltage;
    a calibration unit coupled between the measurement unit and the battery, for providing a plurality of test voltages to the measurement unit; and
    a control unit coupled to the measurement unit and the calibration unit, for controlling the calibration unit and receiving an output voltage of the measurement unit;
    wherein the battery voltage measurement system has a calibration mode and a measurement mode, and under the calibration mode, the calibration unit outputs the test voltages to the measurement unit, and the control unit calculates a calibration value according to a relation between the test voltages and the output voltage of the measurement unit; and under the measurement mode, the calibration unit transmits the battery voltage to the measurement unit, and the control unit calibrates the output voltage of the measurement unit according to the calibration value for acquiring the battery voltage.

2. The battery voltage measurement system according to claim 1, wherein the calibration unit includes:
    an isolation unit coupled between the measurement unit and the battery; and
    a voltage generation unit for generating the test voltages to the measurement unit;
    wherein under the calibration mode, the isolation unit isolates the measurement unit from the battery; and under the measurement mode, the isolation unit transmits the battery voltage to the measurement unit.

3. The battery voltage measurement system according to claim 2, wherein the isolation unit comprises:
    a first isolation circuit coupled between a first input end of the measurement unit and a first end of the battery, for isolating the measurement unit from the battery; and
    a second isolation circuit coupled between a second input end of the measurement unit and a second end of the battery, for isolating the measurement unit from the battery.

4. The battery voltage measurement system according to claim 3, wherein the first isolation circuit comprises:
    a PMOS transistor having a source node coupled to the first input end of the measurement unit, and a drain node coupled to the first end of the battery;
    a first resistor coupled between the source node and a gate node of the PMOS transistor;
    a second resistor having one end coupled to the gate node of the PMOS transistor; and
    an NPN transistor having a collector node coupled to another end of the second resistor, an emitter node coupled to a ground, and a base node is coupled to the control unit.

5. The battery voltage measurement system according to claim 3, wherein the second isolation circuit comprises:
    a PMOS transistor having a source node coupled to the second input end of the measurement unit, and a drain node coupled to the second end of the battery;
    a first resistor coupled between the source node and a gate node of the PMOS transistor;
    a second resistor having one end coupled to the gate node of the PMOS transistor; and an NPN transistor having a collector node coupled to another end of the second resistor, an emitter node coupled to a ground, and a base node coupled to the control unit.

6. The battery voltage measurement system according to claim 3, wherein the first isolation circuit and the second isolation circuit are formed by using respective switches.

7. The battery voltage measurement system according to claim 2, wherein the voltage generation unit comprises:
a voltage generation circuit for generating the test voltages;
an enabling circuit coupled between the voltage generation circuit and the battery, for transmitting electric power to the voltage generation circuit according to a determination enabling signal; and
an output isolation circuit coupled between the voltage generation circuit and the measurement unit;
wherein the output isolation circuit is controlled by an output voltage of the enabling circuit.

8. The battery voltage measurement system according to claim 7, wherein the voltage generation circuit comprises:
a plurality of bias voltage generation circuits coupled in parallel between an output end of the enabling circuit and a ground, wherein the bias voltage generation circuits are in correspondence to different bias voltages; and
a voltage division circuit coupled between the bias voltage generation circuits and the output isolation circuit, for generating a first test voltage and a second test voltage to the output isolation circuit.

9. The battery voltage measurement system according to claim 8, wherein each bias voltage generation circuit comprises:
a standard voltage component having a negative end coupled to the output end of the enabling circuit; and
an NPN transistor coupled between a positive end of the standard voltage component and the ground.

10. The battery voltage measurement system according to claim 8, wherein the voltage division circuit is formed by a plurality of series-coupled resistors.

11. The battery voltage measurement system according to claim 7, wherein the enabling circuit comprises:
a PNP transistor having an emitter node coupled to the battery, and a collector node coupled to the voltage generation circuit;
a first resistor coupled between the emitter node and a base node of the PNP transistor;
a second resistor having one end coupled to the base node of the PNP transistor; and
an NPN transistor having a collector node coupled to another end of the second resistor, an emitter node coupled to a ground, and a base node coupled to the control unit.

12. The battery voltage measurement system according to claim 1, wherein the measurement unit comprises:
an operational amplifier having a non-inverted input end and an inverted input end which are coupled to the calibration unit;
a resistor coupled between an output end of the operational amplifier and the second end; and
an analog to digital converter coupled to the output end of the operational amplifier.

13. A battery voltage measurement method, comprising:
providing a plurality of test voltages to a measurement unit in sequence;
calculating a calibration value according to a relation between the test voltages and an output voltage of the measurement unit; and
transmitting a battery voltage to the measurement unit for measuring the battery voltage, and calibrating the output voltage of the measurement unit according to the calibration value.

* * * * *

UNITED STATES PATENT AND TRADEMARK OFFICE
CERTIFICATE OF CORRECTION

| | | |
|---|---|---|
| PATENT NO. | : 8,659,299 B2 | Page 1 of 1 |
| APPLICATION NO. | : 13/223868 | |
| DATED | : February 25, 2014 | |
| INVENTOR(S) | : Ming-Wang Cheng and Hsiang-Chun Hsueh | |

It is certified that error appears in the above-identified patent and that said Letters Patent is hereby corrected as shown below:

On the Title Page, Item (73) should read as follows;

-- (73)   Assignee: LITE-ON CLEAN ENERGY TECHNOLOGY CORP. --.

Signed and Sealed this
Second Day of September, 2014

Michelle K. Lee
*Deputy Director of the United States Patent and Trademark Office*